United States Patent
Shen et al.

(10) Patent No.: US 8,305,809 B2
(45) Date of Patent: *Nov. 6, 2012

(54) METHODS, DEVICES, AND SYSTEMS FOR DEALING WITH THRESHOLD VOLTAGE CHANGE IN MEMORY DEVICES

(75) Inventors: Zhenlei Shen, Boise, ID (US); William H. Radke, Los Gatos, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/305,164

(22) Filed: Nov. 28, 2011

(65) Prior Publication Data

US 2012/0069658 A1    Mar. 22, 2012

Related U.S. Application Data

(63) Continuation of application No. 12/547,280, filed on Aug. 25, 2009, now Pat. No. 8,077,515.

(51) Int. Cl.
*G11C 16/06* (2006.01)

(52) U.S. Cl. .......... 365/185.09; 365/185.2; 365/185.21; 365/185.24

(58) Field of Classification Search .......... 365/185.09, 365/185.2, 185.21, 185.24, 185.17–185.18, 365/205

See application file for complete search history.

(56) References Cited

U.S. PATENT DOCUMENTS

| | | |
|---|---|---|
| 6,262,916 B1 | 7/2001 | Kuriyama et al. |
| 6,377,485 B1 | 4/2002 | Shibata et al. |
| 6,646,646 B2 | 11/2003 | Peterson et al. |
| 6,734,865 B1 | 5/2004 | Peterson et al. |
| 6,741,253 B2 | 5/2004 | Radke et al. |
| 6,784,889 B1 | 8/2004 | Radke |
| 6,791,555 B1 | 9/2004 | Radke et al. |
| 6,816,165 B1 | 11/2004 | Radke |
| 6,856,529 B1 | 2/2005 | Radke |
| 6,956,577 B2 | 10/2005 | Radke et al. |
| 6,963,343 B1 | 11/2005 | Peterson et al. |
| 6,969,883 B2 | 11/2005 | Chindalore et al. |
| 7,020,037 B2 | 3/2006 | Anzai et al. |
| 7,038,946 B2 | 5/2006 | Hosono et al. |
| 7,139,182 B2 | 11/2006 | Radke |
| 7,180,522 B2 | 2/2007 | Radke et al. |
| 7,187,585 B2 | 3/2007 | Li et al. |
| 7,196,946 B2 | 3/2007 | Chen et al. |
| 7,257,025 B2 | 8/2007 | Maayan et al. |
| 7,257,032 B2 | 8/2007 | Fujiu et al. |

(Continued)

OTHER PUBLICATIONS

International Search Report and Written Opinion for related PCT Application PCT/US2010/002266, mailed Jan. 4, 2011 (10 pgs.).

*Primary Examiner* — David Lam

(74) *Attorney, Agent, or Firm* — Brooks, Cameron & Huebsch, PLLC

(57) ABSTRACT

The present disclosure includes methods, devices, and systems for dealing with threshold voltage change in memory devices. A number of embodiments include an array of memory cells and control circuitry having sense circuitry coupled to the array. The control circuitry is configured to determine changes in threshold voltages (Vts) associated with the memory cells without using a reference cell, and adjust the sense circuitry based on the determined changes and without using a reference cell.

26 Claims, 4 Drawing Sheets

U.S. PATENT DOCUMENTS

| | | |
|---|---|---|
| 7,322,002 B2 | 1/2008 | Keays et al. |
| 7,369,434 B2 | 5/2008 | Radke |
| 7,379,068 B2 | 5/2008 | Radke |
| 7,389,465 B2 | 6/2008 | Radke et al. |
| 7,397,477 B2 | 7/2008 | Radke |
| 7,444,579 B2 | 10/2008 | Radke et al. |
| 7,453,723 B2 | 11/2008 | Radke |
| 7,512,909 B2 | 3/2009 | Radke |
| 7,523,381 B2 | 4/2009 | Eggleston et al. |
| 7,561,465 B2 | 7/2009 | Hancock et al. |
| 7,773,421 B2 * | 8/2010 | Hung et al. ............ 365/185.09 |
| 7,849,383 B2 | 12/2010 | Lin |
| 2002/0071314 A1 | 6/2002 | Sakakibara et al. |
| 2005/0268203 A1 | 12/2005 | Keays et al. |
| 2006/0248434 A1 | 11/2006 | Radke et al. |
| 2007/0162824 A1 | 7/2007 | Radke et al. |
| 2007/0226592 A1 | 9/2007 | Radke |
| 2008/0037320 A1 | 2/2008 | Radke |
| 2008/0056027 A1 | 3/2008 | Radke |
| 2008/0072120 A1 | 3/2008 | Radke |
| 2008/0092017 A1 | 4/2008 | Keays et al. |
| 2008/0184094 A1 | 7/2008 | Murray et al. |
| 2008/0215930 A1 | 9/2008 | Radke |
| 2009/0013233 A1 | 1/2009 | Radke |
| 2009/0019321 A1 | 1/2009 | Radke |
| 2009/0019340 A1 | 1/2009 | Radke et al. |
| 2009/0103380 A1 | 4/2009 | Pekny et al. |
| 2009/0109747 A1 | 4/2009 | Radke |
| 2009/0129169 A1 | 5/2009 | Roohparvar et al. |
| 2009/0132755 A1 | 5/2009 | Radke |
| 2009/0132889 A1 | 5/2009 | Radke |

* cited by examiner

300

| Vt Shift (mV) | Tracking Gain (dB) | Data Error Rate |
|---|---|---|
| 20 | 0.220 | 5.0E-20 |
| 40 | 0.446 | 8.0E-19 |
| 60 | 0.677 | 3.0E-17 |
| 80 | 0.915 | 2.0E-15 |
| 100 | 1.160 | 2.0E-13 |
| 120 | 1.412 | 1.0E-11 |
| 140 | 1.671 | 1.0E-9 |
| 160 | 1.938 | 6.0E-8 |
| 180 | 2.214 | 1.0E-6 |
| 200 | 2.499 | 1.0E-5 |

*Fig. 3*

METHODS, DEVICES, AND SYSTEMS FOR DEALING WITH THRESHOLD VOLTAGE CHANGE IN MEMORY DEVICES

CROSS-REFERENCE TO RELATED APPLICATION

This application is a Continuation of U.S. application Ser. No. 12/547,280, filed Aug. 25, 2009, the specification of which is incorporated herein by reference.

TECHNICAL FIELD

The present disclosure relates generally to semiconductor memory devices, methods, and systems, and more particularly, to methods, devices, and systems for dealing with threshold voltage change in memory devices.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption.

Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a desired state. For example, electric charge can be placed on or removed from a charge storage node of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

As flash memory cells undergo programming, sensing, and erase cycles over time, the stored charge on the charge storage node, e.g., the threshold voltage (Vt), of the memory cells can change, which can result in an erroneous sensing of the memory cell. That is, the determined state of a memory cell during a sensing operation performed on the cell may be a state other than the state to which the cell was programmed. One approach to tracking and/or compensating for changes in the Vt of a memory cell can include using a reference cell during a sensing, e.g., read, operation on the memory cell. However, the use of reference cells can increase the area of the memory array, decrease the quantity of memory cells in the array, and/or increase the amount of circuitry associated with the memory device.

BRIEF DESCRIPTION OF THE DRAWINGS

FIG. 3 is a table of tracking gains and error rates associated with a number of changes of Vt distributions associated with memory cells programmed in accordance with a number of embodiments of the present disclosure.

DETAILED DESCRIPTION

Figure 1:
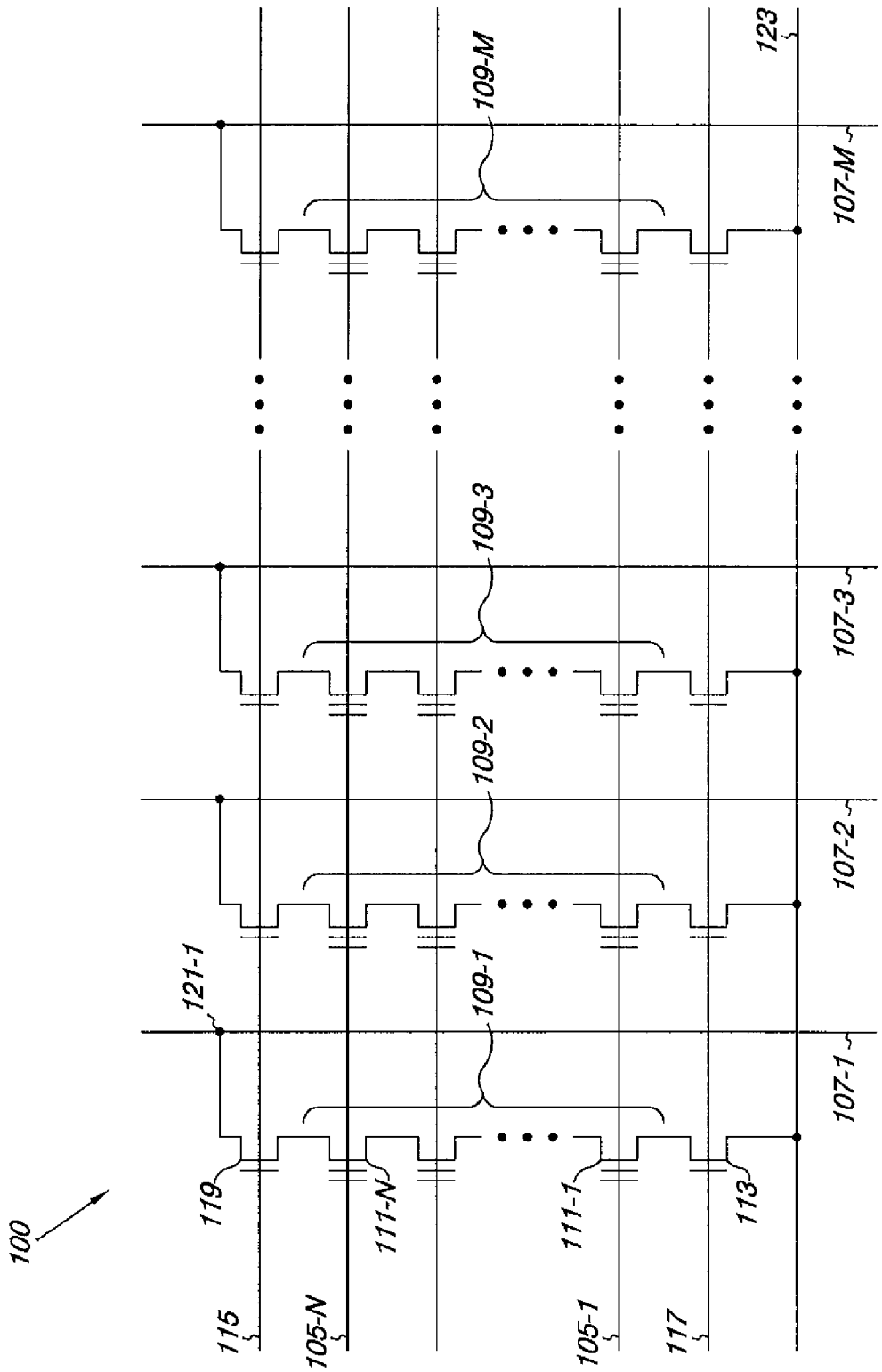
FIG. 1 is a schematic of a portion of a non-volatile memory array in accordance with a number of embodiments of the present disclosure.

The present disclosure includes methods, devices, and systems for dealing with threshold voltage change in memory devices. A number of embodiments include an array of memory cells and control circuitry having sense circuitry coupled to the array. The control circuitry is configured to determine changes in threshold voltages (Vts) associated with the memory cells without using a reference cell, and adjust the sense circuitry based on the determined changes and without using a reference cell.

Embodiments of the present disclosure can be used to determine changes in threshold voltages (Vts) associated with a number of memory cells without using a reference cell, adjust a voltage(s) used to sense a state of the number of memory cells based on the determined Vt changes without using a reference cell, and/or sense a state of the number of memory cells using the adjusted voltages. For example, embodiments of the present disclosure can be used to track and/or compensate for, threshold voltage change, e.g., shift, in memory devices without using a reference cell. Tracking and/or compensating for threshold voltage changes can provide benefits such as increased reliability, e.g., decreased error rate, and/or can increased memory device life, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a schematic of a portion of a non-volatile memory array 100 in accordance with a number of embodiments of the present disclosure. The embodiment of FIG. 1 illustrates a NAND architecture non-volatile memory. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a desired program state, as will be further described herein.

A sensing operation, such as a read or program verify operation, can include sensing a voltage and/or current change of a bit line coupled to a selected cell in order to determine the state of the selected cell. For example, sensing the state of a selected cell can include applying a number of sensing voltages, e.g., read voltages "Vread" to a selected word line, while biasing the word lines coupled to the unselected cells of the string at a number of voltages sufficient to place the unselected cells in a conducting state independent of the threshold voltage of the unselected cells, e.g., pass voltages "Vpass". The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

The sensing voltages, e.g., Vread, used during a sensing operation of a selected cell can be based on a potential Vt of the selected cell. For example, a voltage associated with a Vt associated with one of the program states of the selected cell can be used as Vread. A voltage associated with the Vt associated with one of the program states of the selected cell can include, for example, a mean Vt, a Vt distribution, and/or a Vt distribution width, as will be further described herein.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2A:
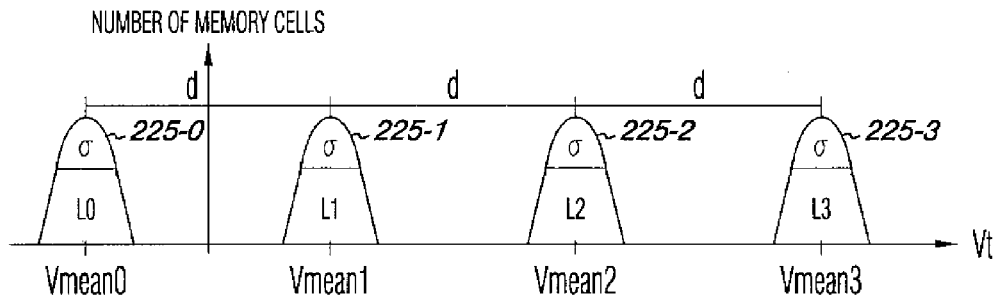
FIG. 2A illustrates a number of threshold voltage (Vt) distributions associated with memory cells programmed in accordance with a number of embodiments of the present disclosure.

FIG. 2A illustrates a number of threshold voltage (Vt) distributions associated with memory cells, e.g., memory cells 111-1, . . . , 111-N shown in FIG. 1, programmed in accordance with a number of embodiments of the present disclosure. In the embodiment shown in FIG. 2A, the Vt distributions 225-0, 225-1, 225-2, and 225-3 represent memory cells programmed to one of four program states L0, L1, L2, and L3, respectively. However, embodiments of the present disclosure are not limited to memory cells programmed to a particular number of states, e.g., the memory cells may be programmed to more or fewer than four program states. As one of skill in the art will appreciate, the program states L0, L1, L2, and L3, can represent a number of stored data digits. For example, state L0 can represent binary data "11" stored by a data cell, state L1 can represent binary data "01" stored by a cell, state L2 can represent binary data "00" stored by a cell, and state L3 can represent binary data "10" stored by a cell.

In a number of embodiments of the present disclosure, a number of programming voltage pulses can be applied to the control gate of a memory cell in order to program the cell by increasing the Vt level of the cell to a desired level. For example, in the embodiment shown in FIG. 2A, during a programming operation, the Vt level of memory cells to be programmed to program state L1 is increased until the Vt level reaches a Vt level associated with Vt distribution 225-1. The Vt level of memory cells to be programmed to program state L2 is increased until the Vt level reaches a Vt level associated with Vt distribution 225-2. The Vt level of memory cells to be programmed to program state L3 is increased until the Vt level reaches a Vt level associated with Vt distribution 225-3.

A Vt distribution can include a number of Vt levels. For example, a Vt distribution can include a mean Vt level, among other Vt levels. A mean Vt level can correspond to an expected Vt level for a given Vt distribution. In a number of embodiments, a mean Vt level can correspond to the peak of its associated Vt distribution, e.g., a mean Vt level of a particular Vt distribution can represent the most common Vt level of memory cells programmed to the program state corresponding to the particular Vt distribution. However, embodiments of the present disclosure are not so limited. For example, a mean Vt level may not correspond to the peak of its associated Vt distribution if its associated Vt distribution is asymmetrical.

In the embodiment shown in FIG. 2A, each Vt distribution includes a mean Vt level, e.g., Vt distribution 225-0 includes Vmean0, Vt distribution 225-1 includes Vmean1, Vt distribution 225-2 includes Vmean2, and Vt distribution 225-3 includes Vmean3. Additionally, the difference in voltage between mean Vt levels associated with adjacent Vt distributions is shown as "d" in FIG. 2A. That is, d illustrates the difference in voltage between Vmean1 and Vmean0, the difference in voltage between Vmean2 and Vmean1, and the difference in voltage between Vmean3 and Vmean2.

A Vt distribution can also have a Vt distribution width associated therewith. A Vt distribution width can correspond to a range of Vt levels associated with a particular Vt distribution. In the embodiment shown in FIG. 2A, Vt distribution width a is associated with Vt distributions 225-0, 225-1, 225-2, and 225-3. Vt distribution width a can correspond to the range of Vt levels within one standard deviation of the mean Vt level for a particular Vt distribution. For example, Vt distribution width σ can correspond to the range of Vt levels within one standard deviation of Vmean0 for Vt distribution 225-0, the range of Vt levels within one standard deviation of Vmean1 for Vt distribution 225-1, the range of Vt levels within one standard deviation of Vmean2 for Vt distribution 225-2, and the range of Vt levels within one standard deviation of Vmean3 for Vt distribution 225-3. However, embodiments of the present disclosure are not so limited, and can include other Vt distribution widths. For example, a Vt distribution width can correspond to the range of all Vt levels associated with a particular Vt distribution.

In a number of embodiments of the present disclosure, the sensing voltages used during a sensing operation of a memory cell programmed to a program state associated with a Vt distribution shown in FIG. 2A can be based on the Vt distributions shown in FIG. 2A. For example, the sensing voltages can be Vt levels associated with the Vt distributions, such as mean Vt levels, e.g., Vmean0, Vmean1, Vmean2, and/or Vmean3, and/or Vt levels associated with the Vt distribution widths, such as σ.

A sensing operation of a memory cell programmed to a program state associated with a Vt distribution shown in FIG. 2A can have an error rate, e.g., error ratio, associated with the sensed state. That is, the sensed state of the memory cell may be a state other than the state to which the cell was programmed. The error rate, e.g., the ratio of the number of times the sensed state of a memory cell is a state other than the state to which the cell was programmed to the total number of times the state of a memory cell is sensed, can be given by:

$$Q((d/2)/\sigma)$$

where Q is a tail probability of a standard Gaussian distribution.

Figure 2B:
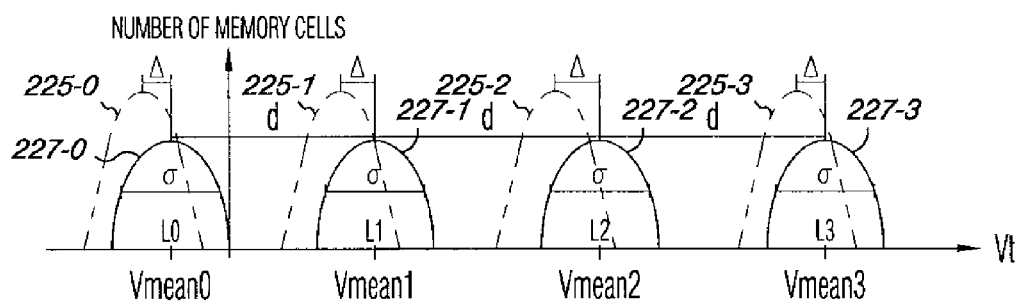
FIG. 2B illustrates a number of Vt distributions associated with memory cells programmed in accordance with a number of embodiments of the present disclosure.

FIG. 2B illustrates a number of Vt distributions associated with memory cells, e.g., memory cells 111-1, ..., 111-N shown in FIG. 1, programmed in accordance with a number of embodiments of the present disclosure. In the embodiment shown in FIG. 2B, the Vt distributions 227-0 227-1, 227-2, and 227-3 represent memory cells programmed to one of four program states L0, L1, L2, and L3, respectively, in a manner analogous to that previously described in connection with FIG. 2A, wherein the memory cells have also undergone a number of additional programming, sensing, and/or erase cycles. The additional programming, sensing, and/or erase cycles can cause the stored charge on the floating gate of the memory cells to change, which can result in a change, e.g., shift, of the Vt distributions, as shown in FIG. 2B. That is, the additional programming, sensing, and/or erase cycles can cause Vt distribution 225-0 to change to Vt distribution 227-0, Vt distribution 225-1 to change to Vt distribution 227-1, Vt distribution 225-2 to change to Vt distribution 227-2, and Vt distribution 225-3 to change to Vt distribution 227-3.

As shown in FIG. 2B, the change of the Vt distributions can cause the Vt levels associated with the Vt distributions to change. For example, the change of the Vt distributions can cause the mean Vt levels associated with the Vt distributions to change. The change in the mean Vt levels is shown as "Δ" in FIG. 2B. That is, Δ illustrates the change in Vmean0, Vmean1, Vmean2, and Vmean3 that results from the change of Vt distribution 225-0 to Vt distribution 227-0, Vt distribution 225-1 to Vt distribution 227-1, Vt distribution 225-2 to Vt distribution 227-2, and Vt distribution 225-3 to Vt distribution 227-3, respectively.

The change of the Vt distributions can also cause the Vt distribution widths associated with the Vt distributions to change, as shown in FIG. 2B. For example, the change of the Vt distributions can cause Vt distribution width σ to change, e.g., become wider.

The magnitude of the change of the Vt distributions, e.g., the magnitude of the changes of the Vt levels and/or Vt distribution widths associated with the Vt distributions, can depend on the number of programming, sensing, and/or erase cycles performed on the memory cells associated with the Vt distributions. The magnitude of the change of the Vt distributions can also depend on the temperature(s) the memory cells are exposed to during the cycles. For example, the magnitude of the change of the Vt distributions may increase as the number of cycles performed on the memory cells increases and/or as the temperature(s) the memory cells are exposed to during the cycles increases.

A change, e.g., shift, of a Vt distribution, such as the change of the Vt distributions shown in FIG. 2B, can result in an erroneous sensing of a memory cell associated with the Vt distribution if the Vt distribution change is not tracked and/or compensated for. That is, if a change of a Vt distribution is not tracked and/or compensated for, the sensed state of a memory cell associated with the Vt distribution may be a state other than the state to which the cell was programmed. For example, the sensed state of a memory cell programmed to program state L1 may be program state L2.

The error rate of a sensing operation of a memory cell associated with a Vt distribution that has undergone a change can be given by:

$$Q(((d/2)-\Delta)/\sigma)$$

where Q is a tail probability of a standard Gaussian distribution, and d, $\Delta$, and $\sigma$ are the d, $\Delta$, and $\sigma$ associated with FIG. 2B. The error rate can represent the ratio of the number of times the sensed state of a memory cell is a state other than the state to which the cell was programmed due to the Vt distribution change to the total number of times the state of a memory cell is sensed. Additionally, the tracking gain associated with a Vt distribution that has undergone a change can be given by:

$$20*\log_{10}((d/2)/((d/2)-\Delta))$$

where d is the d associated with FIG. 2A and $\Delta$ is the $\Delta$ associated with FIG. 2B. The tracking gain can be used to determine the number of memory cells whose sensed state may not be the state to which the cell was programmed due to the Vt distribution change. Hence, a greater change in mean Vt levels $\Delta$ associated with a Vt distribution change and/or a greater Vt distribution width $\sigma$ associated with a Vt distribution change can result in a greater error rate of a sensing operation of memory cells associated with the changed Vt distribution and/or a greater number of memory cells associated with the changed Vt distribution whose sensed state may not be the state to which the cell was programmed.

FIG. 3 is a table 300 of tracking gains and error rates, e.g., error ratios, associated with a number of changes, e.g., shifts, of Vt distributions associated with memory cells programmed in accordance with a number of embodiments of the present disclosure. The memory cells were programmed to one of four program states L0, L1, L2, and L3 in a manner analogous to that previously described in connection with FIG. 2A, and the Vt distributions, e.g., the Vt levels associated with the Vt distributions, were increased in 20 millivolt (mV) increments, with the difference in voltage between adjacent mean Vt levels, e.g., d, held at 1600 mV. The tracking gain and error rate associated with each Vt distribution were determined using the formulas previously described in connection with FIG. 2B.

The error rate associated with each Vt distribution can represent the error rate that occurs when the Vt distribution changes are not tracked and/or compensated for. Failure to track and/or compensate for the Vt distribution changes can result in erroneous sensing of the memory cells. The tracking gain associated with each Vt distribution can represent the potential benefit that can be gained by tracking and/or compensating for the Vt distribution changes. For example, the tracking gain can represent the extent to which the erroneous sensing of the memory cells can be decreased by tracking and/or compensating for the Vt distribution changes in accordance with a number of embodiments of the present disclosure.

As shown in table 300, the tracking gains and error rates increase as the Vt distribution change increases. For example, the tracking gain and error rate associated with a Vt distribution change of 60 mV were 0.677 dB and 3.0E-17, respectively, and the tracking gain and error rate associated with a Vt distribution change of 80 mV were 0.915 dB and 2.0E-15, respectively. However, an error correction code (ECC) decoder may only be capable of correcting an error rate of 1.0E-15 or less, e.g., an error correction operation may fail if the error rate exceeds 1.0E-15. Hence, an ECC decoder may not be able to track and/or compensate for a Vt distribution change of 80 mV or greater.

Figure 4:
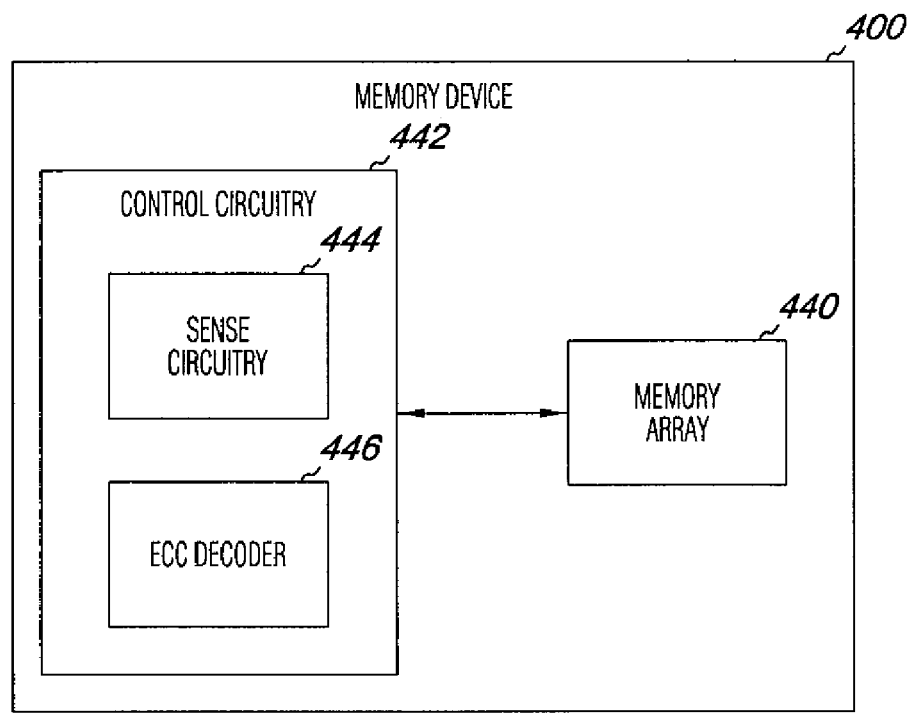
FIG. 4 illustrates a block diagram of a memory device in accordance with a number of embodiments of the present disclosure.

FIG. 4 illustrates a block diagram of a memory device 400 in accordance with a number of embodiments of the present disclosure. As shown in FIG. 4, memory device 400 includes memory array 440. Memory array 440 can be, for example, memory array 100 previously described in connection with FIG. 1. Memory array 440 can include, for example, single level memory cells (SLCs) and/or multilevel memory cells (MLCs) that can store four program states. However, embodiments are not so limited, and can include other MLCs. In a number of embodiments, memory array 440 may not include any reference memory cells, e.g., memory array 440 may include only data memory cells.

In a number of embodiments, memory device 400 can perform hard sensing operations. That is, in the absence of changes in the Vts of the memory cells in memory array 440, memory array 440 can determine the state(s) of the memory cells in memory array 440 using sensed Vts without outputting the sensed Vts to control circuitry 442.

As shown in FIG. 4, memory device 400 also includes control circuitry 442 coupled to memory array 440. Control circuitry 442 includes sense circuitry 444 and error correction code (ECC) decoder 446. Control circuitry 442 can determine changes in the threshold voltages (Vts), e.g., Vt distributions, Vt levels such as mean Vt levels, and/or Vt distribution widths, associated with the memory cells in memory array 440 without using a reference cell. Control circuitry 442 can then adjust sense circuitry 444, e.g., adjust voltages used by sense circuitry 444, to sense a state of the memory cells based on the determined Vt changes without using a reference cell. Sense circuitry 444 can then sense a state of the memory cells in memory array 440 using the adjusted Vts. That is, control circuitry 442 can track and/or compensate for Vt changes in the memory cells in memory array 440 without using a reference cell.

For example, sense circuitry 444 can sense a state of the memory cells using a first voltage to sense a cell programmed to a particular program state. ECC decoder 446 can then perform an error correction operation on the sensed state. If the error correction operation results in a failure, sense circuitry 444 can sense a state of the memory cells using a second voltage, e.g., a voltage that is different from the first voltage, to sense a cell programmed to the particular program state. ECC decoder 446 can perform an error correction operation on the state sensed using the second voltage, and if this error correction operation also results in a failure, sense circuitry 444 can sense a state of the memory cells using a third voltage, e.g., a voltage that is different from the first and second voltages, to sense a cell programmed to the particular program state. This process can be continued until an error correction operation that does not result in a failure, e.g., a successful error correction operation, occurs. For example, sense circuitry 444 can sense a state of the memory cells using the second voltage only if the error correction operation performed on the state sensed using the first voltage results in a failure.

In a number of embodiments, the process described in the previous paragraph can be performed while memory device 400 is in a test mode. A test mode can be triggered, for example, by an initial failure of an error correction operation, e.g., a failure of an error correction operation that occurs before the process described by the previous paragraph begins.

In a number of embodiments, control circuitry 442 can increase or decrease the voltages used to sense the state of the memory cells by a particular voltage amount. For example, the second voltage can be 20 mV greater than the first voltage, the third voltage can be 20 mV greater than the second voltage, etc. However, embodiments of the present disclosure are not limited to one particular voltage amount, e.g., the voltages can increase or decrease by a voltage amount other than 20 mV, and/or each amount of voltage increase or decrease can be different. In a number of embodiments, the amount of the voltage increase or decrease can depend on the number of programming, sensing, and/or erase cycles previously performed on the memory cells, and/or the age of the memory cells. For example, the amount of the voltage can increase as the number of previously performed programming, sensing, and/or erase cycles increases, and the amount of the voltage can decrease as the age of the memory cells increases.

Additionally, the number of voltages used before a successful error correction operation occurs can depend on the particular voltage amount by which the voltages increase. For example, the number of voltages used before a successful error correction operation occurs may increase as the particular voltage amount by which the voltages increase decreases. Further, in a number of embodiments, sense circuitry 444 may use no more than ten different voltages.

An error correction operation can result in a failure if ECC decoder 446 is unable to correct errors associated with the sensed state. For example, the error correction operation performed on the state sensed using the first voltage can result in a failure if ECC decoder 446 is unable to correct errors associated with the state sensed using the first voltage. ECC decoder 446 may be unable to correct errors associated with the sensed state if the number of errors associated with the sensed state exceeds the correction capability of ECC decoder 446. The correction capability of ECC decoder 446 can be, for example, 12 bit errors.

In a number of embodiments, the first voltage can be a pre-set voltage, e.g., a voltage associated with an initial programming operation. In a number of embodiments, the first voltage can be a voltage determined by control circuitry 442 to be least likely to result in a failure of an error correction operation. Using a voltage that is least likely to result in a failure of an error correction operation can result in fewer sensing and error correction operations performed by sense circuitry 444 and ECC decoder 446, respectively.

Control circuitry 442 can determine the voltage least likely to result in a failure of an error correction operation using a quantity of memory cells programmed to a particular program state and/or a quantity of programming and sensing operations previously performed on the memory cells. For example, the quantity of memory cells programmed to a particular program state and/or the quantity of programming and sensing operations previously performed on the memory cells can be input in an algorithm to determine the voltage least likely to result in a failure of an error correction operation. The algorithm can be implemented in firmware (not shown in FIG. 4) located in control circuitry 442. Alternatively, the algorithm can be implemented in hardware and/or software.

In a number of embodiments in which memory array 440 includes MLCs that can store four program states, sense circuitry 444 can sense a state of the memory cells using a first voltage to sense a first program state and a second voltage to sense a second program state. The first and second program states can be, for example, L1 and L2, respectively, previously described in connection with FIGS. 2A and 2B. ECC decoder 446 can then perform an error correction operation on the sensed state. If the error correction operation results in a failure, sense circuitry 444 can sense a state of the memory cells using a third voltage, e.g., a voltage that is different from the first voltage, as the voltage used to sense the first program state and a fourth voltage, e.g., a voltage that is different from the second voltage, as the voltage used to sense the second program state. ECC decoder 446 can perform an error correction operation on the state sensed using the third voltage and the fourth voltage, and if this error correction operation also results in a failure, sense circuitry 444 can sense a state of the memory cells using a fifth voltage, e.g., a voltage that is different from the first and third voltages, as the voltage used to sense the first program state and a sixth voltage, e.g., a voltage that is different from the second and fourth voltages, as the voltage used to sense the second program state. This process can be continued until an error correction operation that does not result in a failure, e.g., a successful error correction operation, occurs. For example, sense circuitry 444 can sense a state of the memory cells using the third and fourth voltages only if the error correction operation performed on the state sensed using the first and second voltages results in a failure. Further, an error correction operation can result in a failure if ECC decoder 446 is unable to correct errors associated with the sensed state, as previously described herein.

The process described in the previous paragraph can be performed while memory device 400 is in a test mode. Additionally, the voltages can increase or decrease by a particular voltage amount. For example, the third voltage can be 20 mV greater than the first voltage, the fifth voltage can be 20 mV greater than the third voltage, etc. However, embodiments of the present disclosure are not limited to one particular voltage amount, e.g., the voltages can increase or decrease by a voltage amount other than 20 mV, and/or each amount of voltage increase or decrease can be different. Additionally, the amount of the voltage increase or decrease can depend on the number of programming, sensing, and/or erase cycles previously performed on the memory cells, as previously described herein. Further, the number of voltages used before a successful error correction operation occurs can depend on the particular voltage amount by which the voltages increase, as previously described herein.

In a number of embodiments, the first and second voltages can be pre-set voltages, e.g., voltages associated with an initial programming operation. In a number of embodiments, the first and second voltages can be voltages determined by control circuitry 442 to be least likely to result in a failure of an error correction operation. Control circuitry 442 can determine the voltages least likely to result in a failure of an error correction operation using a quantity of memory cells programmed to a particular program state, e.g., the first program state and/or the second program state, and/or a quantity of programming and sensing operations previously performed on the memory cells, as previously described herein.

A number of previous approaches to tracking and/or compensating for changes in the Vt of a memory cell can include using a reference cell during a sensing, e.g., read, operation on the memory cell. However, the use of reference cells can increase the area of a memory array, decrease the quantity of memory cells in the array, and/or increase the amount of circuitry associated with a memory device. In contrast, tracking and/or compensating for Vt changes in memory cells in accordance with a number of embodiments of the present disclosure, e.g., without using a reference cell, can decrease the area of a memory array, increase the quantity of memory cells in the array, and/or decrease the amount of circuitry associated with a memory device.

The embodiment illustrated in FIG. 4 can include additional circuitry that is not illustrated so as not to obscure embodiments of the present disclosure. For example, memory device 400 can include address circuitry to latch address signals provided over I/O connectors through I/O circuitry. Address signals can be received and decoded by a row decoder and a column decoder, to access memory array 440. It will be appreciated by those skilled in the art that the number of address input connectors can depend on the density and architecture of memory device 400 and/or memory array 440.

Figure 5:
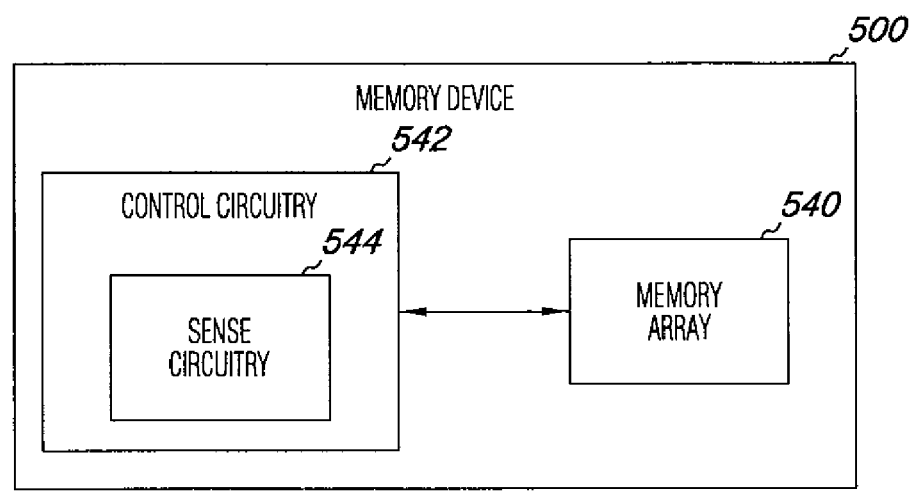
FIG. 5 illustrates a block diagram of a memory device in accordance with a number of embodiments of the present disclosure.

FIG. 5 illustrates a block diagram of a memory device 500 in accordance with a number of embodiments of the present disclosure. As shown in FIG. 5, memory device 500 includes memory array 540. Memory array 540 can be, for example, memory array 100 previously described in connection with FIG. 1. Memory array 540 can include, for example, MLCs, such as MLCs that can store eight or sixteen program states. However, embodiments are not so limited, and can include other types of MLCs and/or SLCs. In a number of embodiments, memory array 540 may not include any reference memory cells, e.g., memory array 540 may include only data memory cells.

In a number of embodiments, memory device 500 can perform soft sensing operations. For example, sensed Vts are output from memory array 540 to control circuitry 542, and control circuitry 542 can determine the state(s) of the memory cells in memory array 540 using the sensed Vts. In a soft sensing operation, the number of sensed states is greater than the number of states stored by the memory cells in memory array 540. For example, in embodiments in which memory array 540 includes MLCs that can store sixteen program states, a soft sensing operation can result in 128 sensed states. A soft sensing operation can provide more information, e.g., reliability information, about the states of the memory cells than a hard sensing operation. The information obtained from a soft sensing operation can be input in an algorithm, e.g., a minimum mean square error (MMSE) algorithm, as will be further described herein.

As shown in FIG. 5, memory device 500 also includes control circuitry 542 coupled to memory array 540. Control circuitry 542 includes sense circuitry 544. Control circuitry 542 can determine changes in the Vts, e.g., Vt distributions, Vt levels such as mean Vt levels, and/or Vt distribution widths, associated with the memory cells in memory array 540 without using a reference cell. Control circuitry 542 can then adjust sense circuitry 544, e.g., adjust voltages used by sense circuitry 544, to sense a state of the memory cells based on the determined Vt changes without using a reference cell. Sense circuitry 544 can then sense a state of the memory cells in memory array 540 using the adjusted Vts. That is, control circuitry 542 can track and/or compensate for Vt changes in the memory cells in memory array 540 without using a reference cell.

For example, sense circuitry 544 can sense Vts, e.g., Vt distributions, Vt levels such as mean Vt levels, and/or Vt distribution widths, associated with the memory cells in memory array 540. Control circuitry 542 can then determine a number of voltages that correspond to a number of program states associated with the memory cells using the sensed Vts, wherein each determined voltage corresponds to a respective one of the number of program states. For example, control circuitry 542 can determine a number of mean Vt levels, Vt distributions, and/or Vt distribution widths using the sensed Vts, wherein each mean Vt level, Vt distribution, and/or Vt distribution width corresponds to a respective one of the number of program states. Control circuitry 542 can then determine the number of voltages that correspond to the number of program states using the determined mean Vt levels, Vt distributions, and/or Vt distribution widths, and sense circuitry 544 can then sense a state of the memory cells using the determined voltages. Alternatively, control circuitry 542 can output the determined mean Vt levels, Vt distributions, and/or Vt distribution widths together with the sensed Vt levels to an ECC decoder, e.g., a soft ECC decoder (not shown in FIG. 5). This can provide more information, e.g., reliability information, about the states of the memory cells, which can result in a greater processing gain.

In a number of embodiments, the sensed Vts can be input in an algorithm to determine the number of voltages that correspond to the number of program states associated with the memory cells. The algorithm can be implemented in firmware (not shown in FIG. 5) located in control circuitry 542. Alternatively, the algorithm can be implemented in hardware and/or software. The algorithm can be, for example, a minimum mean square error (MMSE) algorithm. However, embodiments are not so limited, and can include any algorithm which can determine the number of voltages that correspond to the number of program states.

An MMSE algorithm which can determine the number of voltages that correspond to the number of program states can include an initialization and a number of iterations. The initialization can include the following steps:

set $x_0=0$ Volts, $x_M=5$ Volts;

set $y_m$, m=1, ..., M

M is the number of program states associated with the memory cells, and $y_m$ is the Vt level, e.g., mean Vt level, that corresponds with each program state. For example, if the memory cells are MLCs that can store 8 program states, M is 8, and the 8 $y_m$ values are the 8 Vt levels, e.g., mean Vt levels, that correspond with the 8 program states.

An iteration of the MMSE algorithm can include the following steps:

while $\Delta > \epsilon$, do update $x_m = (y_m + y_{m+1})/2$;

update $y_m = E[S_m]$, $S_m = (x_{m-1}, x_m)$;

set $\Delta = \Sigma |y^t_m - y^{t-1}_m|$

In the iteration, $y_m$ are the determined Vt levels, e.g., determined mean Vt levels, and $x_m$ are the boundary Vts between two Vt distributions, e.g., the decision region boundary. $S_m$ is the decision region for determined Vt levels $y_m$, e.g., the region between two adjacent Vts, and $E[S_m]$ is the expected value of the average of the Vt levels for decision region $S_m$. Additionally, t is the iteration index, e.g., t=1 for the first iteration, t=2 for the second iteration, etc.

Hence, the input of the MMSE algorithm is the sensed Vts associated with the memory cells in array 540, and the output of the MMSE algorithm is the determined Vt levels, e.g., the determined mean Vt levels, $y_m$, and the boundary Vts $x_m$. During each iteration, the sensed Vts are partitioned into the decision region $S_m$ based on a comparison to the boundary Vts, and the determined Vt levels and boundary Vts are updated based on the partitioning.

Further, $\Delta$ represents the discrepancy, e.g. difference, between two successive determined Vt levels, e.g., determined mean Vt levels, $y_m$, e.g., $\Delta$ is a measure of similarity between the results of two successive iterations. If the discrepancy between two successive determined Vt levels does not exceed a particular quantity ϵ, e.g., if the two successive determined Vt levels are similar enough, no further iterations of the algorithm are run, and the algorithm ends. If, however, the discrepancy between two successive determined Vt levels exceeds the particular quantity ϵ, e.g., if the two successive determined Vt levels are not similar enough, an additional iteration of the algorithm is run. That is, iterations of the algorithm are run until the discrepancy between two successive determined Vt levels does not exceed the particular quantity ϵ. The changes in the Vts associated with the memory cells have been tracked, e.g., the Vts that correspond to the program states associated with the memory cells are determined, when the discrepancy between two successive determined Vt levels does not exceed the particular quantity ϵ.

A number of previous approaches to tracking and/or compensating for changes in the Vt of a memory cell can include using a reference cell during a sensing, e.g., read, operation on the memory cell. However, the use of reference cells can increase the area of a memory array, decrease the quantity of memory cells in the array, and/or increase the amount of circuitry associated with a memory device. In contrast, tracking and/or compensating for Vt changes in memory cells in accordance with a number of embodiments of the present disclosure, e.g., without using a reference cell, can decrease the area of a memory array, increase the quantity of memory cells in the array, and/or decrease the amount of circuitry associated with a memory device.

The embodiment illustrated in FIG. 5 can include additional circuitry that is not illustrated so as not to obscure embodiments of the present disclosure. For example, memory device 500 can include address circuitry to latch address signals provided over I/O connectors through I/O circuitry. Address signals can be received and decoded by a row decoder and a column decoder, to access memory array 540. It will be appreciated by those skilled in the art that the number of address input connectors can depend on the density and architecture of memory device 500 and/or memory array 540.

CONCLUSION

The present disclosure includes methods, devices, and systems for dealing with threshold voltage change in memory devices. A number of embodiments include an array of memory cells and control circuitry having sense circuitry coupled to the array. The control circuitry is configured to determine changes in threshold voltages (Vts) associated with the memory cells without using a reference cell, and adjust the sense circuitry based on the determined changes and without using a reference cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
an array of memory cells; and
control circuitry coupled to the array and configured to:
determine changes in threshold voltages associated with the memory cells without using a reference cell by:
sensing a state of the memory cells; and
performing an error correction operation on the sensed state; and
adjust a voltage used to sense a state of the memory cells based on the determined changes and without using a reference cell.

2. The memory device of claim 1, wherein the control circuitry is configured to:
determine changes in the threshold voltages associated with the memory cells by sensing a state of the memory cells using a first voltage; and
adjust the voltage used to sense the state of the memory cells to the first voltage if the error correction operation does not result in a failure.

3. The memory device of claim 2, wherein the control circuitry is configured to:
determine changes in the threshold voltages associated with the memory cells by:
sensing a state of the memory cells using a second voltage if the error correction operation results in a failure; and
performing an error correction operation on the state sensed using the second voltage; and
adjust the voltage used to sense the state of the memory cells to the second voltage if the error correction operation performed on the state sensed using the second voltage does not result in a failure.

4. The memory device of claim 2, wherein the error correction operation results in a failure if a number of errors associated with the state sensed using the first voltage exceeds an error correction capability of the control circuitry.

5. The memory device of claim 2, wherein the first voltage is a voltage determined by the control circuitry to be least likely to result in a failure of the error correction operation.

6. The memory device of claim 1, wherein the control circuitry is configured to determine changes in the threshold voltages associated with the memory cells in response to an initial failure of an error correction operation.

7. A memory device, comprising:
an array of memory cells; and
control circuitry coupled to the array and configured to:
determine changes in threshold voltages associated with the memory cells without using a reference cell by:
sensing threshold voltages associated with the memory cells; and
determining a number of voltages that correspond to a number of states associated with the memory cells using the sensed threshold voltages, wherein each determined voltage corresponds to a respective one of the number of states; and adjust a voltage used to sense a state of the memory cells based on the determined changes and without using a reference cell.

8. The memory device of claim 7, wherein the control circuitry is configured to determine changes in the threshold voltages associated with the memory cells by outputting the sensed threshold voltages and the determined number of voltages to an error correction code decoder.

9. The memory device of claim 7, wherein:
the sensed threshold voltages associated with the memory cells include threshold voltage distributions associated with the memory cells; and
the number of voltages that correspond to the number of states associated with the memory cells are determined using the threshold voltage distributions.

10. The memory device of claim 7, wherein:
the sensed threshold voltages associated with the memory cells include mean threshold voltage levels associated with the memory cells; and
the number of voltages that correspond to the number of states associated with the memory cells are determined using the mean threshold voltage levels.

11. The memory device of claim 7, wherein:
the sensed threshold voltages associated with the memory cells include threshold voltage distribution widths associated with the memory cells; and
the number of voltages that correspond to the number of states associated with the memory cells are determined using the threshold voltage distribution widths.

12. The memory device of claim 7, wherein the array of memory cells includes only data cells.

13. A method for operating a memory device, comprising:
determining changes in threshold voltages associated with a number of memory cells without using a reference cell, wherein determining changes in the threshold voltages associated with the number of memory cells includes:
sensing a state of the number of memory cells; and
performing an error correction operation on the sensed state;
adjusting a voltage used to sense a state of the number of memory cells based on the determined changes and without using a reference cell; and
sensing a state of the number of memory cells using the adjusted voltage.

14. The method of claim 13, wherein determining changes in the threshold voltages associated with the number of memory cells includes:
sensing a state of the number of memory cells using a first voltage;
performing an error correction operation on the state sensed using the first voltage;
sensing a state of the number of memory cells using a second voltage if the error correction operation performed on the state sensed using the first voltage results in a failure; and
performing an error correction operation on the state sensed using the second voltage.

15. The method of claim 14, wherein the method includes:
adjusting the voltage used to sense the state of the number of memory cells to the first voltage if the error correction operation performed on the state sensed using the first voltage does not result in a failure; and
adjusting the voltage used to sense the state of the number of memory cells to the second voltage if the error correction operation performed on the state sensed using the second voltage does not result in a failure.

16. The method of claim 14, wherein the method includes:
sensing a state of the number of memory cells using a third voltage if the error correction operation performed on the state sensed using the second voltage results in a failure;
performing an error correction operation on the state sensed using the third voltage; and
adjusting the voltage used to sense the state of the number of memory cells to the third voltage if the error correction operation performed on the state sensed using the third voltage does not result in a failure.

17. The method of claim 14, wherein the first voltage is a pre-set voltage.

18. The method of claim 13, wherein:
sensing the state of the number of memory cells includes reading the number of memory cells; and
the voltage used to sense the state of the number of memory cells is a read voltage.

19. A method for operating a memory device, comprising:
determining changes in threshold voltages associated with a number of memory cells without using a reference cell, wherein determining changes in the threshold voltages associated with the number of memory cells includes:
sensing threshold voltages associated with the memory cells; and
determining a number of voltages that correspond to a number of states associated with the number of memory cells using the sensed threshold voltages, wherein each determined voltage corresponds to a respective one of the number of states;
adjusting a voltage used to sense a state of the number of memory cells based on the determined changes and without using a reference cell; and
sensing a state of the number of memory cells using the adjusted voltage.

20. The method of claim 19, wherein sensing threshold voltages associated with the memory cells includes sensing threshold voltage distributions, mean threshold voltage levels, and threshold voltage distribution widths associated with the memory cells.

21. The method of claim 20, wherein the method includes determining the number of voltages that correspond to the number of states associated with the number of memory cells using the sensed threshold voltage distributions, mean threshold voltage levels, and threshold voltage distribution widths.

22. A method for operating a memory device, comprising:
determining changes in threshold voltages associated with a number of memory cells without using a reference cell, wherein determining changes in the threshold voltages associated with the number of memory cells includes:
sensing threshold voltages associated with the memory cells;
determining a number of voltages that correspond to a number of states associated with the number of memory cells using the sensed threshold voltages, wherein each determined voltage corresponds to a respective one of the number of states; and
outputting the sensed threshold voltages and the determined number of voltages to an error correction code decoder; and
adjusting a voltage used to sense a state of the number of memory cells based on the determined changes and without using a reference cell.

23. The method of claim 22, wherein the method includes determining the number of voltages that correspond to the number of states associated with the number of memory cells by inputting the sensed threshold voltages into an algorithm.

24. The method of claim 23, wherein the algorithm is a minimum mean square error algorithm.

25. The method of claim 23, wherein the algorithm includes a number of iterations, wherein each iteration includes:
   partitioning the sensed threshold voltages into a decision region based on a comparison to a boundary threshold voltage; and
   updating the boundary threshold voltage and the number of voltages that correspond to the number of states associated with the number of memory cells based on the partitioning.

26. The method of claim 23, wherein the algorithm ends when a discrepancy between two successive voltages that correspond to the number of states associated with the number of memory cells does not exceed a particular quantity.

* * * * *